US008327062B2

(12) United States Patent
Otterstedt et al.

(10) Patent No.: US 8,327,062 B2
(45) Date of Patent: Dec. 4, 2012

(54) MEMORY CIRCUIT AND METHOD FOR PROGRAMMING IN PARALLEL A NUMBER OF BITS WITHIN DATA BLOCKS

(75) Inventors: Jan Otterstedt, Unterhaching (DE); Thomas Nirschl, Munich (DE); Michael Bollu, Kirchheim (DE); Wolf Allers, Munich (DE)

(73) Assignee: Infineon Technologies AG, Neubiberg (DE)

( * ) Notice: Subject to any disclaimer, the term of this patent is extended or adjusted under 35 U.S.C. 154(b) by 419 days.

(21) Appl. No.: 12/331,206

(22) Filed: Dec. 9, 2008

(65) Prior Publication Data

US 2010/0146189 A1 Jun. 10, 2010

(51) Int. Cl.
*G06F 12/00* (2006.01)
*G06F 12/04* (2006.01)
*G06F 12/06* (2006.01)
*G06F 13/00* (2006.01)
*G11C 16/02* (2006.01)
*G11C 16/16* (2006.01)

(52) U.S. Cl. ................. 711/103; 365/185.11; 365/238.5

(58) Field of Classification Search .................. 711/103; 365/185.11, 185.12, 185.33, 238.5
See application file for complete search history.

(56) References Cited

U.S. PATENT DOCUMENTS 5,430,674 A 7/1995 Javanifard
5,873,112 A * 2/1999 Norman ........................ 711/103
5,944,837 A * 8/1999 Talreja et al. ................. 713/600
6,418,059 B1 * 7/2002 Kreifels et al. .......... 365/185.28
6,747,893 B2 6/2004 Uribe et al.
6,809,962 B2 10/2004 Uribe et al.
6,963,501 B2 * 11/2005 Shiga ....................... 365/185.03
7,242,623 B2 * 7/2007 Cohen ...................... 365/189.07
7,280,392 B2 10/2007 Liaw et al.
7,724,570 B1 * 5/2010 Lindhorst et al. ........ 365/185.08
7,724,571 B1 * 5/2010 Lindhorst et al. ........ 365/185.08
2006/0077720 A1 * 4/2006 Im ........................... 365/185.28
2006/0259716 A1 * 11/2006 Moschopoulos ............. 711/156

OTHER PUBLICATIONS

Hill, F., et al., "Chapter 5: Introduction to a Hardware Programming Language (AHPL)," and "Chapter 8: Microprogramming," Digital Systems: Hardware Organization and Design, Third Edition, 1987, 51 pages, John Wiley & Sons.

(Continued)

*Primary Examiner* — Sanjiv Shah
*Assistant Examiner* — Glenn Gossage
(74) *Attorney, Agent, or Firm* — Slater & Matsil, L.L.P.

(57) ABSTRACT

Non volatile memories and methods of programming thereof are disclosed. In one embodiment, the method of programming a memory array includes receiving a series of data blocks, each data block having a number of bits that are to be programmed, determining the number of bits that are to be programmed in a first data block, determining the number of bits that are to be programmed in a second data block, and writing the first data block and the second data block into the memory array in parallel if the sum of the number of bits that are to be programmed in the first data block and the second data block is not greater than a maximum value. The first and second data blocks may or may not be adjacent data blocks. Improved programming efficiency may be achieved in a memory circuit when the maximum allowable current may be limited by the application or the size of a charge pump. Inverse data may be written in parallel if the sum is greater than the maximum value.

6 Claims, 12 Drawing Sheets

| NUMBER OF DATA BLOCKS | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PER 3k-BIT BLOCK | 15 | | | 16 | | | 14 | | | 14 | | | 9 | | | N/A |
| NUMBER OF SET BITS PER ALTERNATE 3k-BIT BLOCK | N/A | 16 | | | 17 | | | 11 | | | 13 | | | 8 | | |
| NUMBER OF SET BITS PER ALTERNATE 3k-BIT BLOCK | N/A | | 15 | | | 17 | | | 15 | | | 9 | | | N/A | |
| NUMBER OF SET BITS PER INVERSE k-BIT BLOCK | 4 | 3 | 2 | 3 | 4 | 1 | 2 | 4 | 4 | 5 | 0 | 5 | 6 | 4 | 5 | 7 |
| NUMBER OF SET BITS PER INVERSE 2k-BIT BLOCK | 7 | | 5 | | 5 | | 6 | | 9 | | 5 | | 10 | | 12 | |
| NUMBER OF SET BITS PER INVERSE 3k-BIT BLOCK | 9 | | | 8 | | | 10 | | | 10 | | | 15 | | | N/A |
| NUMBER OF SET BITS PER ALTERNATE INVERSE 3k-BIT BLOCK | N/A | 8 | | | 7 | | | 13 | | | 11 | | | 16 | | |
| NUMBER OF SET BITS PER ALTERNATE INVERSE 3k-BIT BLOCK | N/A | | 9 | | | 7 | | | 9 | | | 15 | | | N/A | |
| NUMBER OF SET BITS PROGRAMMED TOGETHER | 9 | | | 8 | | | 6 | | 9 | | | 9 | | | 4 | |
| NUMBER OF SET BITS PROGRAMMED TOGETHER INCLUDING POSSIBLE INVERSION INDICATOR | 10 | | | 9 | | | 7 | | 10 | | | 9 | | | 4 | |
| COUNT OF WRITTEN BLOCKS | 1 | | | 2 | | | 3 | | 4 | | | 5 | | | 6 | |

OTHER PUBLICATIONS

Kernighan, B.W., et al., "Chapter 5: Pointers and Arrays," and "Chapter 7: Input and Output," The C Programming Language, Second Edition, 1988, 30 pages.

Silvagni, A., et al., "An Overview of Logic Architectures Inside Flash Memory Devices," Proceedings of the IEEE, vol. 91, No. 4, Apr. 2003, pp. 569-580.

* cited by examiner

FIG. 1A

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PROGRAMMED TOGETHER | 9 | | 6 | 5 | 4 | 7 | 10 | | 7 | | 8 | 3 | 6 | | 4 | |
| COUNT OF WRITTEN BLOCKS | 1 | | 2 | 3 | 4 | 5 | 6 | | 7 | | 8 | 9 | 10 | | 11 | |

FIG. 2A

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PER 2k-BIT BLOCK | N/A | 11 | | 9 | | 13 | | 8 | | 11 | | 5 | | 7 | | N/A |
| NUMBER OF SET BITS PROGRAMMED TOGETHER | 9 | | 6 | 9 | | 7 | 10 | | 7 | | 8 | 5 | | 7 | | 1 |
| COUNT OF WRITTEN BLOCKS | 1 | | 2 | 3 | | 4 | 5 | | 6 | | 7 | 8 | | 9 | | 10 |

FIG. 3A

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 01001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PER 2k-BIT BLOCK | N/A | 11 | | 9 | | 13 | | 8 | | 11 | | 5 | | 7 | | N/A |
| NUMBER OF SET BITS PER 3k-BIT BLOCK | 15 | | | 16 | | | 14 | | | 14 | | | 9 | | | N/A |
| NUMBER OF SET BITS PER 3k-BIT BLOCK | N/A | 16 | | | 17 | | | 11 | | | 13 | | | 8 | | |
| NUMBER OF SET BITS PER 3k-BIT BLOCK | N/A | | 15 | | | 17 | | | 15 | | | 9 | | | N/A | |
| NUMBER OF SET BITS PROGRAMMED TOGETHER | 9 | | 6 | 9 | | 7 | 10 | | 7 | | 8 | 9 | | | 4 | |
| COUNT OF WRITTEN BLOCKS | 1 | | 2 | 3 | | 4 | 5 | | 6 | | 7 | 8 | | | 9 | |

FIG. 4

| NUMBER OF DATA BLOCKS | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PER INVERSE k-BIT BLOCK | 4 | 3 | 2 | 3 | 4 | 1 | 2 | 4 | 4 | 5 | 0 | 5 | 6 | 4 | 5 | 7 |
| NUMBER OF SET BITS PER INVERSE 2k-BIT BLOCK | 7 | | 5 | | 5 | | 6 | | 9 | | 5 | | 10 | | 12 | |
| NUMBER OF SET BITS PROGRAMMED TOGETHER | 7 | | 5 | | 5 | | 6 | | 7 | | 5 | | 6 | | 4 | |
| NUMBER OF SET BITS PROGRAMMED TOGETHER INCLUDING POSSIBLE INVERSION INDICATOR | 8 | | 6 | | 6 | | 7 | | 7 | | 6 | | 6 | | 4 | |
| COUNT OF WRITTEN BLOCKS | 1 | | 2 | | 3 | | 4 | | 5 | | 6 | | 7 | | 8 | |

FIG. 5A

| NUMBER OF DATA BLOCKS | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PER 3k-BIT BLOCK | 15 | | | 16 | | | 14 | | | 14 | | | 9 | | | N/A |
| NUMBER OF SET BITS PER INVERSE k-BIT BLOCK | 4 | 3 | 2 | 3 | 4 | 1 | 2 | 4 | 4 | 5 | 0 | 5 | 6 | 4 | 5 | 7 |
| NUMBER OF SET BITS PER INVERSE 2k-BIT BLOCK | 7 | | 5 | | 5 | | 6 | | 9 | | 5 | | 10 | | 12 | |
| NUMBER OF SET BITS PER INVERSE 3k-BIT BLOCK | 9 | | | 8 | | | 10 | | | 10 | | | 15 | | | N/A |
| NUMBER OF SET BITS PROGRAMMED TOGETHER | 9 | | | 8 | | | 6 | | 7 | | 5 | | 9 | | | 1 |
| NUMBER OF SET BITS PROGRAMMED TOGETHER INCLUDING POSSIBLE INVERSION INDICATOR | 10 | | | 9 | | | 7 | | 7 | | 6 | | 9 | | | 1 |
| COUNT OF WRITTEN BLOCKS | 1 | | | 2 | | | 3 | | 4 | | 5 | | 6 | | | 7 |

FIG. 6

| NUMBER OF DATA BLOCKS | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PER 3k-BIT BLOCK | 15 | | | 16 | | | 14 | | | 14 | | | 9 | | | N/A |
| NUMBER OF SET BITS PER ALTERNATE 3k-BIT BLOCK | N/A | 16 | | | 17 | | | 11 | | | 13 | | | 8 | | |
| NUMBER OF SET BITS PER ALTERNATE 3k-BIT BLOCK | N/A | | 15 | | | 17 | | | 15 | | | 9 | | | N/A | |
| NUMBER OF SET BITS PER INVERSE k-BIT BLOCK | 4 | 3 | 2 | 3 | 4 | 1 | 2 | 4 | 4 | 5 | 0 | 5 | 6 | 4 | 5 | 7 |
| NUMBER OF SET BITS PER INVERSE 2k-BIT BLOCK | 7 | | 5 | | 5 | | 6 | | 9 | | 5 | | 10 | | 12 | |
| NUMBER OF SET BITS PER INVERSE 3k-BIT BLOCK | 9 | | | 8 | | | 10 | | | 10 | | | 15 | | | N/A |
| NUMBER OF SET BITS PER ALTERNATE INVERSE 3k-BIT BLOCK | N/A | 8 | | | 7 | | | 13 | | | 11 | | | 16 | | |
| NUMBER OF SET BITS PER ALTERNATE INVERSE 3k-BIT BLOCK | N/A | | 9 | | | 7 | | | 9 | | | 15 | | | N/A | |
| NUMBER OF SET BITS PROGRAMMED TOGETHER | 9 | | | 8 | | | 6 | | 9 | | | 9 | | | 4 | |
| NUMBER OF SET BITS PROGRAMMED TOGETHER INCLUDING POSSIBLE INVERSION INDICATOR | 10 | | | 9 | | | 7 | | 10 | | | 9 | | | 4 | |
| COUNT OF WRITTEN BLOCKS | 1 | | | 2 | | | 3 | | 4 | | | 5 | | | 6 | |

FIG. 7

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| DATA BITS | 1001011 | 10011011 | 10011111 | 11011010 | 10010110 | 11011111 | 11011011 | 01011100 | 10100011 | 00100011 | 11111111 | 10101000 | 00100001 | 11100010 | 10100010 | 00100000 |
| NUMBER OF SET BITS PER k-BIT BLOCK | 4 | 5 | 6 | 5 | 4 | 7 | 6 | 4 | 4 | 3 | 8 | 3 | 2 | 4 | 3 | 1 |
| NUMBER OF SET BITS PER 2k-BIT BLOCK | 9 | | 11 | | 11 | | 10 | | 7 | | 11 | | 6 | | 4 | |
| NUMBER OF SET BITS PROGRAMMED TOGETHER | 4 | 5 | 6 | 5 | 4 | 7 | 6 | 4 | 7 | | 8 | 3 | 6 | | 4 | |
| COUNT OF WRITTEN BLOCKS | 1 | 2 | 3 | 4 | 5 | 6 | 7 | 8 | 9 | | 10 | 11 | 12 | | 13 | |

| BLOCKS WRITTEN TOGETHER | 1, 3 | 2, 4 | 5, 12, 15 | 6, 10 | 7, 8 | 9, 14, 16 | 11, 13 |
|---|---|---|---|---|---|---|---|
| BITS WRITTEN | 10 | 10 | 10 | 10 | 10 | 9 | 10 |
| NUMBER OF WRITING BLOCK | 1 | 2 | 3 | 4 | 5 | 6 | 7 |

MEMORY CIRCUIT AND METHOD FOR PROGRAMMING IN PARALLEL A NUMBER OF BITS WITHIN DATA BLOCKS

TECHNICAL FIELD

The present invention relates generally to semiconductor memories, and in particular embodiments to programming non volatile memories.

BACKGROUND

A non-volatile memory array includes non-volatile devices such as floating gate transistors. The floating gate transistors are programmed by storing a charge on the floating gate. The charge on the floating gate shifts the conductivity of the channel upon application of an activation voltage. The channel conductivity of the memory transistors (hence, the memory state) is detected by sensing the current flowing through the device.

The programming of memory cells is typically accomplished a word at a time but conventionally requires that the drain of selected cells be placed at e.g., six or seven volts, the gate at eleven or twelve volts, and the source at ground. This programming operation draws substantial source to drain current because the gate terminal is raised above the level of the drain and source terminals while a significant potential difference is placed between the drain and source terminals.

One way of improving the speed of the programming process is to program more devices in parallel. However, programming more transistors draws a larger current. The current to the transistors is provided by charge pump circuits due to the high voltage required for programming. Further, many elements of non volatile memories (such as gate dielectric) do not scale easily and limit any decrease in programming voltage.

Charge pump circuits provide a high voltage output from a lower voltage source. However, the maximum current that can be drawn from a charge pump is limited. An increase in total current output from the charge pump requires a corresponding increase in die area that is counter productive to the economics driving scaling.

Hence, what are needed in the art are improved circuits and ways of programming semiconductor memories.

SUMMARY OF THE INVENTION

These and other problems are generally solved or circumvented, and technical advantages are generally achieved, by preferred embodiments of the present invention.

Embodiments of the invention include programming non volatile memories. In accordance with a preferred embodiment of the present invention, a method of programming a memory array comprises receiving a series of data blocks, each data block having a number of bits that are to be programmed, determining the number of bits that are to be programmed in a first data block, determining the number of bits that are to be programmed in a second data block, and writing the first and the second data blocks into a memory array in parallel if the sum of the number of bits that are to be programmed in the first data block and the second data block is not greater than a maximum value.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those of ordinary skill in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1*a* and 1*b*, together illustrate a write algorithm wherein data blocks are summed over two adjacent data blocks, in accordance with an embodiment of the invention;

FIGS. 2*a* and 2*b*, together illustrate a write algorithm wherein data blocks are summed over any two adjacent data blocks to minimize the number of write operations, in accordance with an embodiment of the invention;

FIGS. 3*a* and 3*b*, together illustrate a write algorithm wherein data blocks are summed over two or three adjacent data blocks to minimize the number of write operations, in accordance with an embodiment of the invention;

FIG. 4 illustrates a write algorithm wherein data blocks are summed over two adjacent data blocks and inverse data blocks, in accordance with an embodiment of the invention;

FIGS. 5*a* and 5*b*, together illustrate a write algorithm wherein data blocks are summed over two or three adjacent data blocks and inverse data blocks, in accordance with an embodiment of the invention;

FIG. 6 illustrates a write algorithm wherein data blocks are summed over any two or any three adjacent data blocks and inverse data blocks, in accordance with an embodiment of the invention;

FIG. 7 illustrates a write algorithm wherein data blocks are summed over adjacent data blocks, wherein the total programming current is reduced without degrading the writing efficiency, in accordance with an embodiment of the invention;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1B:
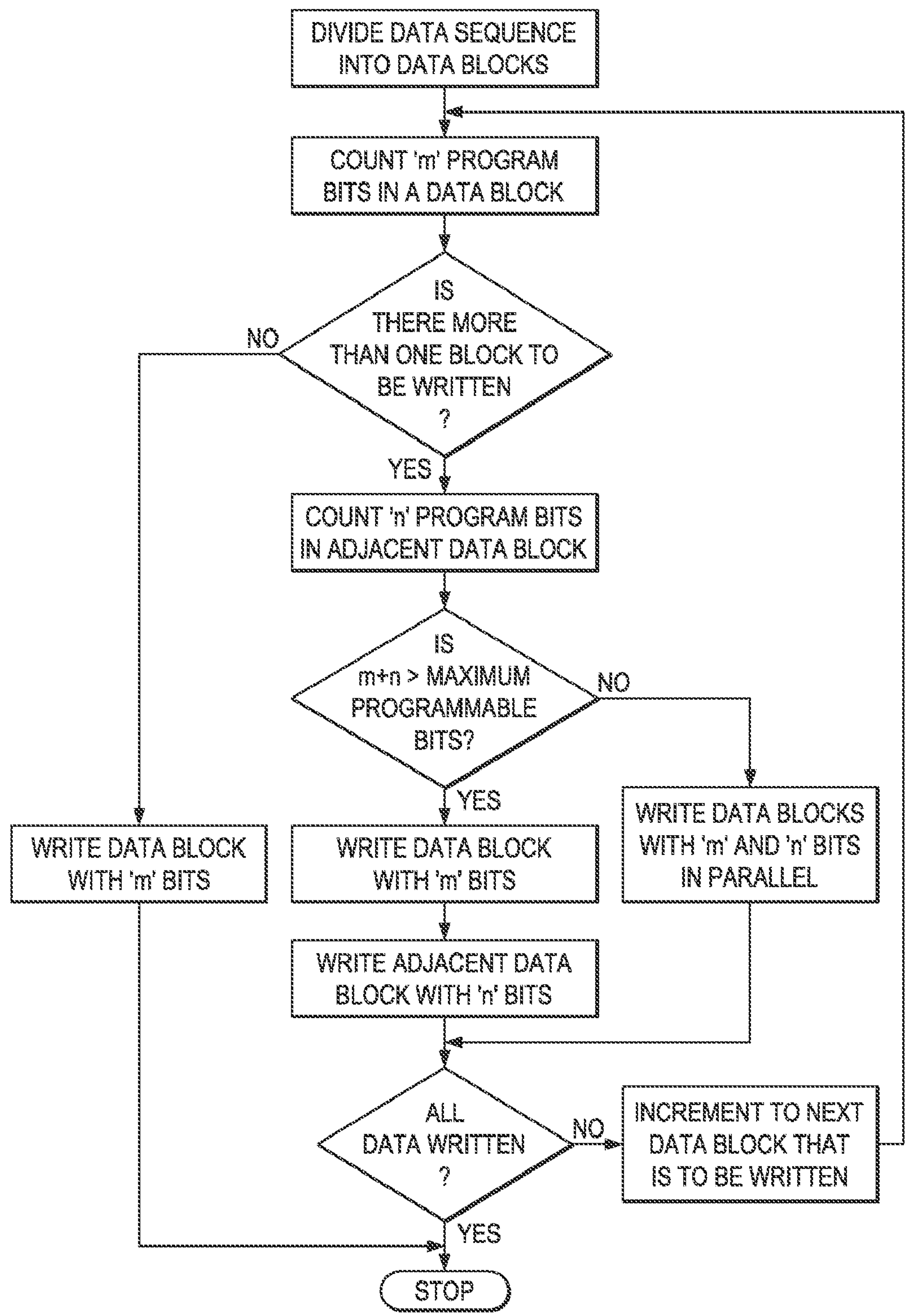

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely programming non volatile memories. The invention may also be applied, however, to other operations as well as to other devices such as volatile memories.

In many non-volatile memories, the number of bits (e.g., the number of "1"s) that may be programmed simultaneously is limited by the maximum available current. In particular, non-volatile memories that are programmed with hot electron injection or hot hole injection require relatively high currents to generate these hot carriers. Examples of non-volatile memories that require high currents include conventional flash devices as well as emerging memories such as phase change memories, Magnetoresistive Random Access Memory (MRAM), and Conductive bridging random access memory (CBRAM), where in some cases the number of memory cells with a changing or toggling content defines the consumed current. The maximum available current is limited by the application, for example, hand held devices with limited battery have very limited available current. Similarly, the size of the charge pump limits the available current. An increase in the maximum number of simultaneously programmable bits ($n_{max}$) requires an appropriate increase in the die area of the charge pump.

When the total available current is $I_{max}$, and the current needed for a single write operation is $I_s$, the maximum number of bits that can be programmed in parallel comprises $I_{max}/I_s$. For example, if every written bit requires 100 microamps (μA) and an overall current of 1 milliamp (mA) is available, not more than 10 bits can be written into the non-volatile memory in parallel. Typically, when a certain amount of data bits (x) is written, blocks of $n_{max}$ bit data are written into the non-volatile memory in parallel until all the x bits are written independent of the number of bits that are to be programmed (e.g. number of "1"s) within these bits. Hence, the write sequence is selected for the worst case so that when all the bits in the data bits (x) comprise bits that are to be programmed, then the writing is performed at 100% efficiency. However, in most applications, on average, only half the data bits comprise bits that are to be programmed, and hence only half the available current is used. In various embodiments, the present invention overcomes these limitations and writes at a higher efficiency and effectively uses the available programming current.

In a different approach, a variable number of data bits are written simultaneously so that the available current is used effectively. If the number of data bits written is selected to completely use all the programming current, an efficiency of 100% is possible. However, this approach has many drawbacks. For example, the write time is not constant but rather depends on the data, for example, the number of bits that are to be programmed in the data. Both the software and the hardware required to implement such an algorithm is quite complex and prohibitive because the number of cases to be handled is equal to the number of possible widths. In various embodiments, these limitations are overcome by preselecting data widths (or transistors) that are programmed in parallel. For example, only a certain numbers of transistors can be programmed in parallel. Examples include programming data widths (or transistors) of q, 2 q, 3 q, 4 q, in one embodiment, wherein q is the smallest preselected data width that is programmed. Alternately, data widths of q, 1.5 q, 2 q are chosen in another embodiment. The larger data width is selected from the preselected data widths within the constraint that the current drawn by all the transistors is less than or equal to the maximum current achievable from the charge pump.

An embodiment of the invention of improving programming efficiency will be described with respect to FIGS. 1*a* and 1*b*, wherein data is written using only two sizes, the larger one being double the smaller one. Alternate embodiments will then be described in conjunction with FIGS. 2*a*-8. A block diagram of a memory circuit used in various embodiments will be described using FIG. 9.

FIGS. 1*a* and 1*b*, together illustrate an embodiment of the invention improving write performance efficiency without a significant increase in hardware complexity. FIG. 1*a* illustrates a table, whereas FIG. 1*b* illustrates a flow chart of the programming method.

As illustrated in the table of FIG. 1*a*, an arbitrary array of a data block sequence (data to be written) comprising 16 data blocks is shown. Each data block is comprised of, for example, 8 data bits (here, k=8). Each data bit can be either a "1" or a "0". A data bit that is to be programmed or set comprises a value "1." Hence as described above, the number of "1"s limits the number of data bits that can be programmed in parallel. The first row is a data block sequence (data bits) to be programmed, and the second row illustrates the number of data bits that are to be programmed or set ($n_r$) per k bit block in the data sequence. Hence, the first column (data block) of the second row shows a value of 4 for the first data block corresponding to the number of data bits that are to be programmed. The third row illustrates the number of bits that are to be programmed in adjacent data blocks, for example, first and second data blocks, and then third and fourth data blocks ($n_1+n_2$, $n_3+n_4$, . . . $n_r+n_{r+1}$). Hence, the third row comprises half the number of data blocks as the data to be written (8 data blocks in this case). Hence, if the maximum programmable data bits $n_{max}$ (data bits that can be programmed in parallel) is 10, the third row illustrates that the first two data blocks can be written simultaneously. If the number of data bits in each element of the third row is not greater than the maximum programmable data bits $n_{max}$, then a 100% increase in efficiency (8 blocks versus 16 blocks) is achieved. However, if an element in the third row is more than the maximum programmable data bits $n_{max}$, the data bits are written as separate blocks.

The data blocks written together are illustrated in the fourth row for the data bit sequence illustrated in the first row of FIG. 1*a*. Hence, the first and second data blocks are written together whereas the third and fourth data blocks are written separately. The data sequence is hence written as eleven data blocks using this approach. Hence, a 45% increase in efficiency (11 data blocks versus 16 data blocks) is obtained for this particular data block sequence. When on average only half the data bits are "1s," the average efficiency increase obtained for random data using this algorithm is about 81%. Hence, about 20% of the time, the data blocks can not be combined.

Although illustrated with summing up two adjacent blocks, in various embodiments more adjacent data blocks may be summed together. For example, in one embodiment, two adjacent blocks (e.g., $n_r+n_{r+1}$) as well three adjacent blocks (e.g., $n_r+n_{r+1}+n_{r+2}$) can be summed. If the number of bits that are to be programmed in the three adjacent blocks is not greater than the maximum programmable bits $n_{max}$, then the three adjacent blocks are written together. For example, in FIG. 1*a*, the data blocks in columns thirteen, fourteen and fifteen can be programmed together, resulting in an overall increase in efficiency of 60% for this example. Similarly, in another embodiment, up to four blocks of data can be combined. Hence, for example, the data blocks in columns thirteen, fourteen, fifteen, and sixteen can be programmed together, resulting in an overall increase in efficiency of 78% for this example.

Figure 2B:
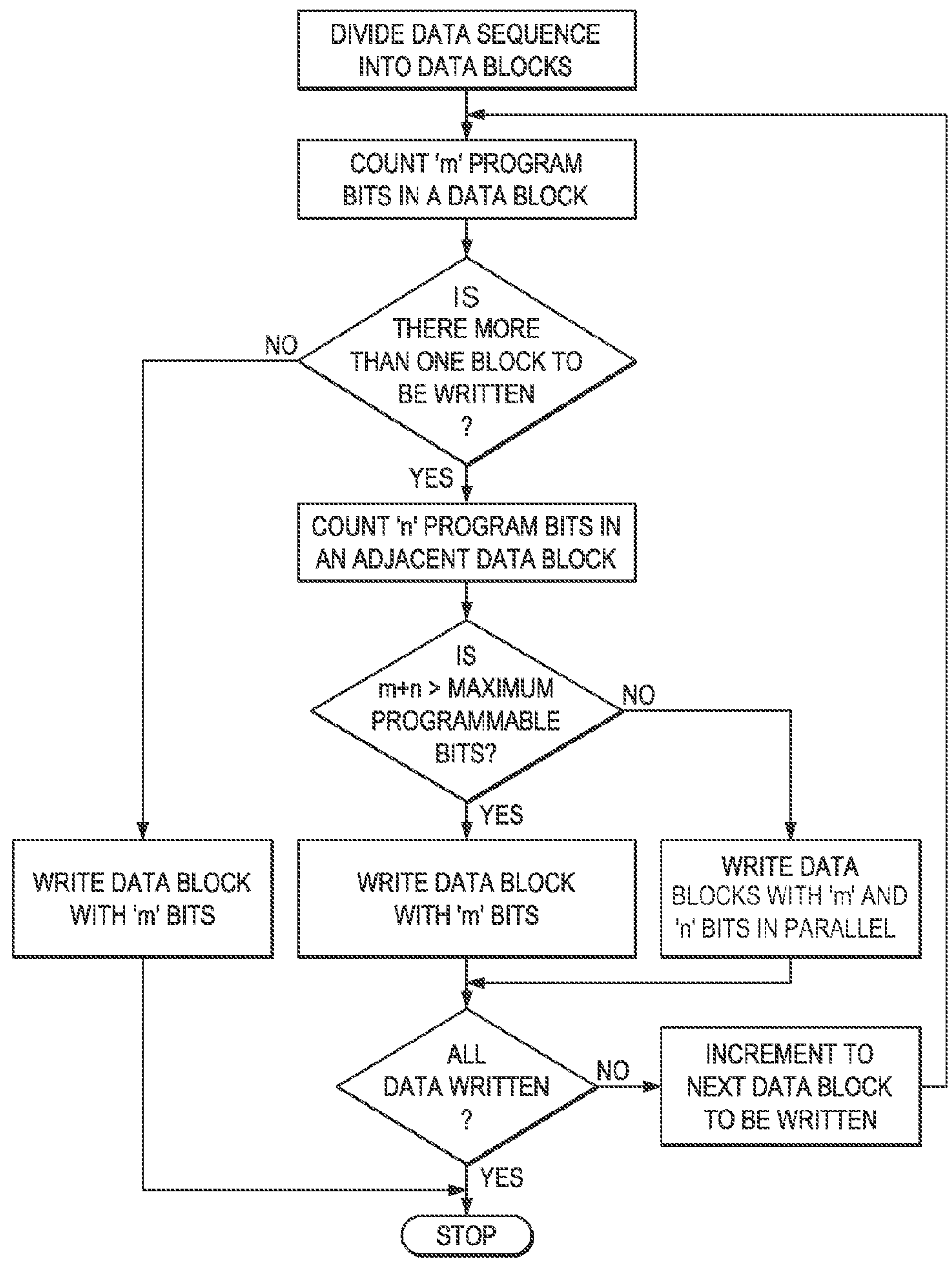

FIGS. 2*a* and 2*b*, together illustrate an embodiment of the invention for further optimization of the write sequence. FIG.

2*a* illustrates a table as in FIG. 1*a*, whereas FIG. 2*b* illustrates a flow chart. As in the prior embodiment, the first row lists the data sequence, the second row lists the number of bits that are to be programmed or set per k bit block, and the third row lists the number of bits that are to be programmed or set summed over adjacent columns (per 2 k bit block). As described above, the third row comprises bits that are to be programmed in adjacent data blocks, (for example, $n_1+n_2$, $n_3+n_4$, . . . $n_r+n_{r+1}$). Unlike the prior embodiment, a further row (fourth row) is added that sums over adjacent blocks in the second and third data blocks, (for example, $n_2+n_3$, $n_4+n_5$, . . . $n_{r+1}+n_{r+2}$).

The fifth row, which corresponds to the fourth row in FIG. 1*a*, illustrates the data blocks used to write the data sequence (number of set bits programmed together). The first column in the fifth row includes the first and the second data block. The second column also similar to FIG. 1*a* uses the third data block. However, the third column unlike the prior embodiment includes both the fourth and fifth data blocks. This is because as illustrated in the fourth row, the fourth and the fifth data blocks can be combined to less than the maximum programmable bits $n_{max}$. Hence, using this embodiment further efficiency gain is obtained. For example, for the data sequence shown in the first row, the data can be programmed as ten data blocks (shown in the fifth row) instead of the eleven in the prior embodiment. Hence, an improvement of 60% is obtained (10 blocks versus the original 16 blocks). When on an average only half the data bits are “1s,” the average efficiency increase for random data obtained using this algorithm is about 83%. This embodiment may also include addition over multiple data blocks (e.g., $n_{r+1}+n_{r+2}+n_{r+3}$) to improve efficiency further as described above.

Figure 3B:
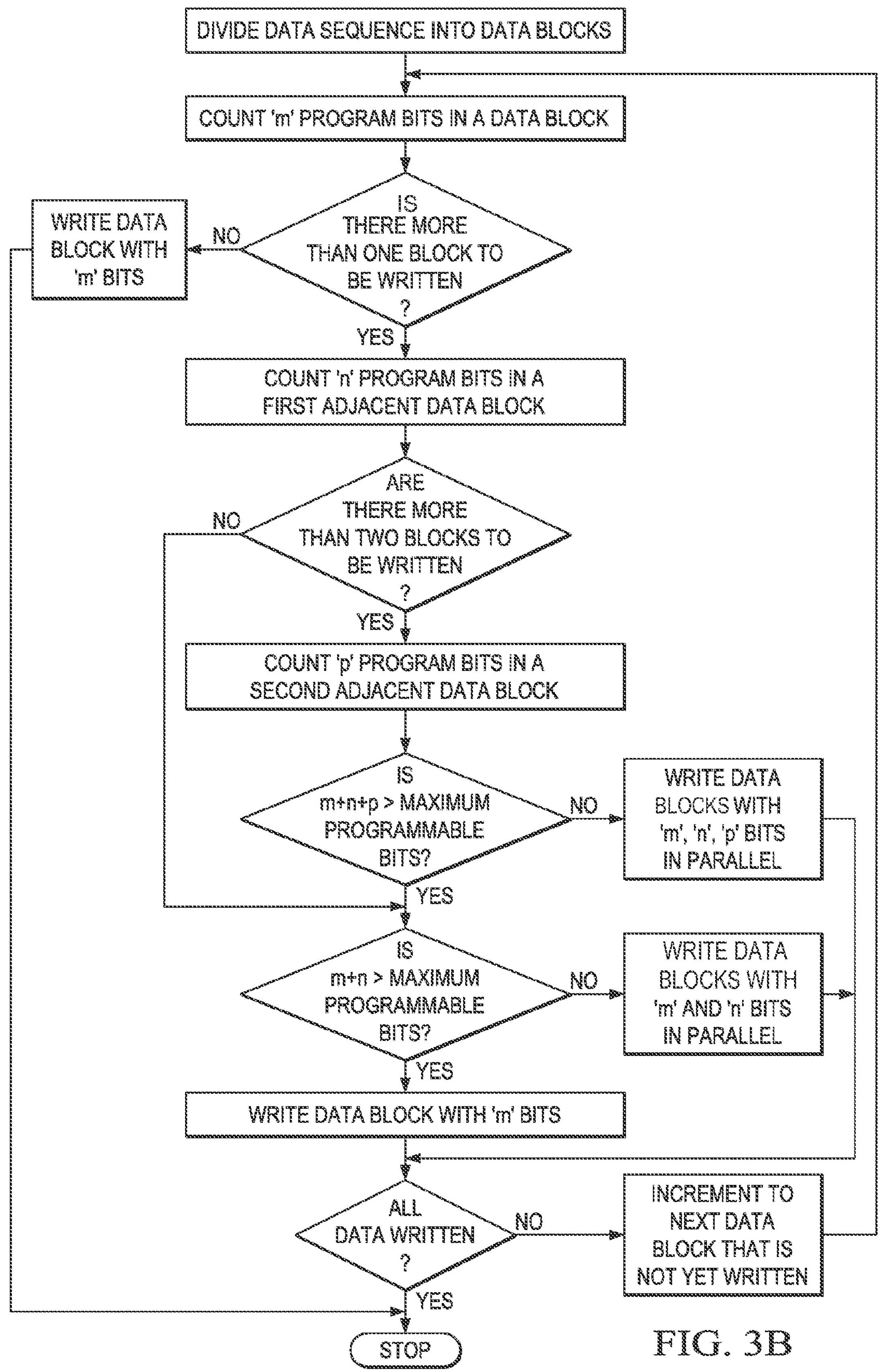

FIG. 3*a* illustrates a write algorithm wherein the data blocks are summed over two or three adjacent data blocks to minimize the number of write operations, in accordance with an embodiment of the invention. As in the prior embodiment of FIG. 2*a*, the first row lists the data sequence, the second row lists the number of bits that are to be programmed, and the third row lists the number of bits that are to be programmed summed over adjacent data blocks. The fourth row also lists the summation over two adjacent data blocks as described in FIG. 2*a*. Unlike the prior embodiment, the fifth, sixth and seventh rows list the summation over three adjacent blocks, for example, the fifth row lists summation over $n_r+n_{r+1}+n_{r+2}$, the sixth row lists summation over $n_{r+1}+n_{r+2}+n_{r+3}$, and the seventh row lists summation over $n_{r-1}+n_r+n_{r+1}$. Hence, as listed in the eighth row, the two or three adjacent data blocks are selected to minimize the number of write operations. For example, the twelfth, thirteenth and fourteenth data blocks are selected together and written in parallel. As shown in the table, the data sequence shown is processed in nine steps with an overall efficiency gain of about 78% for this example.

FIG. 4 illustrates an embodiment that writes data as either a “1” as described above, or as inverse data, wherein “1”s are stored as “0”s and “0”s are stored as “1”s. Storing data in inverse can save write operations if the number of “0”s are lower than the number of “1”s. However, the data block must include an additional bit to identify the data type as either inverse or not. Although there is a loss in storage efficiency to include this additional bit, this can be offset by the gains obtained by using such an algorithm, especially for particular types of data.

Referring to FIG. 4, additional rows are added to FIG. 1*a* to show the number of inverse data bits that need to be programmed in a single data block ($u_r$) (fourth row, showing the number of set bits per inverse k-bit block) and the number of inverse data bits in adjacent columns (fifth row). For example, in the fifth row, two adjacent blocks (e.g., $u_r+U_{r+1}$) are summed. If the inverse bits that are to be programmed in the adjacent blocks is less than the maximum programmable bits $n_{max}$, then the adjacent blocks are written together as inverse data, while indicating the inversion by writing an additional “1” in the additional bit described above.

Hence, the first and the second data blocks are programmed together in the normal mode as described in FIG. 1. However, the third and fourth blocks are programmed together using inverse mode, thus reducing the number of write operations needed. Hence, all the data blocks are programmed in eight data blocks while the normal mode embodiment requires eleven data blocks. While there is a loss in storage efficiency that arises from the need to include the information regarding the data bit mode, this can be offset by the gains in efficiency in some embodiments. The efficiency gain of this process is 100%. Advantageously, and unlike the prior embodiments, the gain in efficiency for this example with 8 bits per data block and $n_{max}$=10 is independent of the data.

Figure 5B:
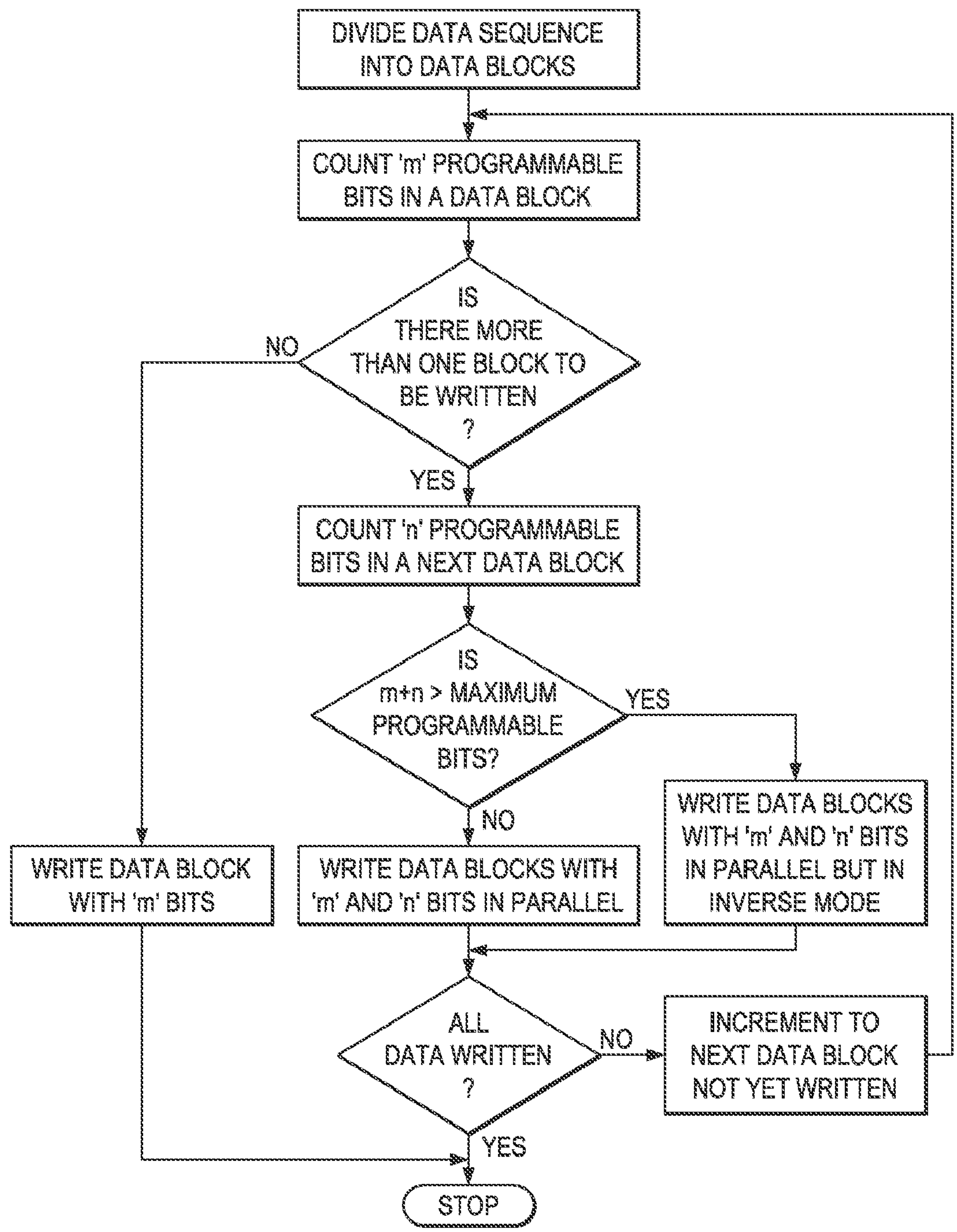

FIGS. 5*a* and 5*b*, together illustrate an embodiment of the invention using normal and inverse data. While the first, second, and third rows are similar to FIG. 4, further rows are added as described above with respect to FIG. 3 to add more than one adjacent data block. While the third row sums over two adjacent blocks (e.g., $n_r+n_{r+1}$), the fourth row sums over three adjacent blocks (e.g., $n_r+n_{r+1}+n_{r+2}$). If the bits that are to be programmed in the three adjacent blocks is not greater than the maximum programmable bits $n_{max}$, then the three adjacent blocks are written together. Similarly, an additional row is added that sums over three adjacent blocks in the inverse data block (e.g., $u_r+u_{r+1}+u_{r+2}$). If the number of inverse bits that are to be programmed in the three adjacent blocks is less than the maximum programmable bits $n_{max}$, then the three adjacent blocks are written together as inverse data, again adding a “1” for indication of inverse data. The efficiency gain is about 128% for this example.

FIG. 6 illustrates an embodiment in which three adjacent blocks are summed in both normal and inverse data mode. Additional rows are added to show additional summations (e.g. the fifth row shows summation over $n_{r+1}+n_{r+2}+n_{r+3}$ and the sixth row shows summation over $n_{r-1}+n_r+n_{r+1}$). Similarly, additional rows are added in the inverse data space. As shown in the table, the data sequence shown is processed in six steps with an overall efficiency gain of about 167% for this example. Hence, at any given data sequence, the selection proceeds by selecting the minimum number of bits summed over two adjacent blocks or three adjacent blocks.

In various embodiments, the write optimization algorithms described above can be configured on a chip. As the summation is performed over a finite number of data blocks (e.g. 2 for the embodiments of FIG. 1*a*), the level of complexity of the hardware is minimal. In various embodiments, the hardware can either use embodiments of the invention or use a fixed number of data blocks, thus using writing widths independent of the data.

FIG. 7 illustrates an embodiment wherein the maximum number of programmable bits $n_{max}$ is reduced without a significant decrease in write efficiency. In FIG. 7, the maximum number of programmable bits $n_{max}$ is reduced to 8 compared to FIG. 1*a* wherein the maximum number of programmable bits $n_{max}$ is 10. In this embodiment, the total number of write operations is 13, a 23% increase in efficiency despite the reduction in the total current available for programming.

As illustrated in FIG. 7, the improved writing operation can be used to reduce circuit area of the device, for example, by reducing the area of the charge pumps. This is possible by reducing the total current available for the write operation. For example, the maximum number of programmable bits $n_{max}$ can be reduced using embodiments of the invention without having an impact on the total write time. With a reduction in the total current from the charge pump, the area of the charge pump can be scaled down as the size of the capacitors can be reduced. As the capacitors of the charge pumps consume considerable area, a significant saving in die size is possible. This embodiment may be further preferred in power sensitive devices such as hand held devices.

Figures 8, 9:
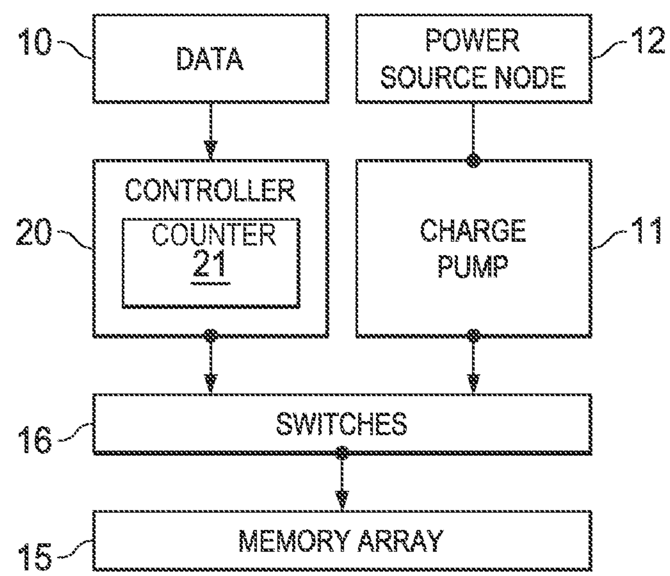
FIG. 8 illustrates a write algorithm wherein data blocks are summed over any two or any three data blocks, in accordance with an embodiment of the invention.
FIG. 9 illustrates a block diagram of a memory circuit in accordance with an embodiment of the invention.

FIG. 8, illustrates an embodiment wherein data blocks are selected to maximize the number of bits written by selecting data block combinations as near to the maximum programmable bits $n_{max}$ bits to program as possible. In this embodiment, the data is first buffered and the number of data bits in each data block is calculated as illustrated in FIG. 1*a*. However, in this embodiment, data blocks are selected to maximize the number of bits that are written together. For example, FIG. 8 shows the data sequence of FIG. 1*a* written using this embodiment. In the first cycle, the data blocks in the first, and the third column are selected to form a single block of ten bits that is programmed in parallel. In the second cycle, the second and the fourth data block are selected. Similarly, as illustrated in FIG. 8, the rest of the data sequence is written in just 7 cycles.

FIG. 9 illustrates an embodiment of the invention showing a block diagram of a memory circuit. The memory circuit includes a charge pump 11 coupled to a power source node 12. The charge pump is designed to supply voltage that is higher than the supply voltage. For example, the charge pump supplies an output voltage of 12V used in the write or erase operations of the memory array 15. Voltage from the charge pump is supplied to the memory array, for example, through switches 16. For example, word line and bit line switches are coupled to respective word lines and bit lines of the memory array and to the charge pump 11 in one embodiment. The bit lines and the word lines provide the voltage on each memory device of the memory array 15. The controller 20 processes the data sequence 10 to be written onto the memory array 15 and provides information regarding the number and position of bits and hence the number of memory devices that are simultaneously written. The controller 20 comprises a counting means 21 to count the number of bits that are to be programmed in a series of data blocks of data to be written. In one embodiment the controller 20 comprises a processor. The switches 16 use the information from the controller 20 and couple a set of memory devices in parallel. In various embodiments, the controller 20 uses any one of the algorithms as described in the embodiments of FIGS. 1*a*-8 in selecting the number of bits written together. In various embodiments, the memory array 15 comprises non-volatile memory such as Flash memory devices.

In describing embodiments of the invention, tables are used only as a way to explain the algorithms, the actual implementation may not require generation of such tables.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that many of the features, functions described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of programming a memory array, the method comprising:

providing data to be written having a plurality of first data blocks of a first length, each block of the plurality of first data blocks comprising bits that are to be written;

defining a plurality of second data blocks of a second length in the data to be written, the second length being larger than the first length;

calculating a first value, the first value being the number of bits in a first block of the plurality of second data blocks;

defining a plurality of third data blocks of a third length in the data to be written, the third length being larger than the second length;

calculating a second value, the second value being the number of bits in a first block of the plurality of third data blocks;

defining a plurality of fourth data blocks of the second length in the data to be written, the plurality of fourth blocks comprising an inverse of the bits in the data to be written;

calculating a third value, the third value being the number of bits in a first block of the plurality of fourth data blocks;

defining a plurality of fifth data blocks of the third length in the data to be written, the plurality of fifth blocks comprising the inverse of the bits in the data to be written;

calculating a fourth value, the fourth value being the number of bits in a first block of the plurality of fifth data blocks;

if the second value is less than a maximum allowable number of bits that can be programmed in parallel and if the fourth value is not less than the maximum allowable number of bits that can be programmed in parallel, then writing the bits in the first block of the plurality of third data blocks into the memory array;

if the fourth value is less than the maximum allowable number of bits that can be programmed in parallel and if the second value is not less than the maximum allowable number of hits that can be programmed in parallel, then writing the bits in the first block of the plurality of fifth data blocks into the memory array;

if the second value is not less than the maximum allowable number of bits that can be programmed in parallel and if the fourth value is not less than the maximum allowable number of bits that can be programmed in parallel and if the first value is less than the maximum allowable number of bits that can be programmed in parallel, then writing the bits in the first block of the plurality of second data blocks into the memory array; and if the second value is not less than the maximum allowable number of bits that can be programmed in parallel and if the fourth value is not less than the maximum allowable number of bits that can be programmed in parallel and if the third value is less than the maximum allowable number of bits that can be programmed in parallel, then writing the bits in the first block of the plurality of fourth data blocks into the memory array.

2. The method of claim 1, wherein the second length and the third length are integer multiples of the first length.

3. The method of claim 1, wherein the maximum allowable number of bits that can be programmed in parallel is determined by a capacity of a charge pump.

4. A memory circuit comprising:

a nonvolatile memory array comprising nonvolatile memory devices;

a charge pump coupled to the nonvolatile memory array, the charge pump powering a programming of the nonvolatile memory devices;

a memory controller coupled to the nonvolatile memory array, wherein the memory controller is configured to receive data to be written having a plurality of first data blocks of a first length, each block of the plurality of first data blocks comprising bits that are to be written;

define a plurality of second data blocks of a second length in the data to be written, the second length being larger than the first length;

calculate a first value, the first value being the number of bits in a first block of the plurality of second data blocks;

define a plurality of third data blocks of a third length in the data to be written, third length being larger than the second length;

calculate a second value, the second value being the number of bits in a first block of the plurality of third data blocks;

define a plurality of fourth data blocks of the second length in the data to be written, the plurality of fourth blocks comprising an inverse of the bits in the data to be written;

calculate a third value, the third value being the number of bits in a first block of the plurality of fourth data blocks;

define a plurality of fifth data blocks of the third length in the data to be written, the plurality of fifth blocks comprising the inverse of the bits in the data to be written;

calculate a fourth value, the fourth value being the number of bits in a first block of the plurality of fifth data blocks;

if the second value is less than a maximum allowable number of bits that can be programmed in parallel and if the fourth value is not less than the maximum allowable number of bits that can be programmed in parallel, then write the bits in the first block of the plurality of third data blocks into the nonvolatile memory array;

if the fourth value is less than the maximum allowable number of bits that can be programmed in parallel and if the second value not less than the maximum allowable number of bits that can be programmed in parallel, then write the bits in the first block of the plurality of fifth data blocks into the nonvolatile memory array;

if the second value is not less than the maximum allowable number of bits that can be programmed in parallel and if the fourth value is not less than the maximum allowable number of bits that can be programmed in parallel and if the first value is less than the maximum allowable number of bits that can be programmed in parallel, then write the bits in the first block of the plurality of second data blocks into the nonvolatile memory array; and if the second value is not less than the maximum allowable number of bits that can be programmed in parallel and if the fourth value is not less than the maximum allowable number of bits that can be programmed in parallel and if the third value is less than the maximum allowable number of bits that can be programmed in parallel, then write the bits in the first block of the plurality of fourth data blocks into the non nonvolatile memory array; and a switch coupled between the charge pump and the nonvolatile memory array, wherein the switch is configured to couple a portion of the nonvolatile memory devices with the charge pump.

5. The circuit of claim 4, wherein the second length and the third length are integer multiples of the first length.

6. The circuit of claim 4, wherein the maximum allowable number of bits that can be programmed in parallel is determined by a capacity of the charge pump.

* * * * *

UNITED STATES PATENT AND TRADEMARK OFFICE

CERTIFICATE OF CORRECTION

PATENT NO. : 8,327,062 B2
APPLICATION NO. : 12/331206
DATED : December 4, 2012
INVENTOR(S) : Jan Otterstedt It is certified that error appears in the above-identified patent and that said Letters Patent is hereby corrected as shown below:

In the Claims

Col. 8, line 51, claim 1, delete “hits” and insert --bits--.
Col. 9, line 26, claim 4, before “third” insert --the--.
Col. 10, line 10, claim 4, after “value” insert --is--.
Col. 10, line 32, claim 4, delete “non”.

Signed and Sealed this
Eighth Day of April, 2014

Michelle K. Lee
*Deputy Director of the United States Patent and Trademark Office*